United States Patent [19]

Totsuka et al.

[11] Patent Number: 5,563,020
[45] Date of Patent: Oct. 8, 1996

[54] PHOTOSENSITIVE TRANSFER SHEET

[75] Inventors: Mikio Totsuka; Takekatsu Sugiyama, both of Shizuoka, Japan

[73] Assignee: Fuji Photo Film Co., Ltd., Kanagawa, Japan

[21] Appl. No.: 427,165

[22] Filed: Apr. 24, 1995

[30] Foreign Application Priority Data

Apr. 26, 1994 [JP] Japan .................................. 6-088600

[51] Int. Cl.$^6$ ................................... G03C 1/805
[52] U.S. Cl. .................. 430/259; 430/260; 430/262; 430/919; 430/925
[58] Field of Search .................. 430/262, 142, 430/179, 283, 284, 259, 143, 260, 925, 919, 920

[56] References Cited

U.S. PATENT DOCUMENTS

| 5,053,300 | 10/1991 | Imai et al. .................. 430/15 |
| 5,362,874 | 11/1994 | Iwakura et al. . | |

FOREIGN PATENT DOCUMENTS

| 59-97140 | 6/1984 | Japan . |
| 61-188537 | 8/1986 | Japan . |
| 3-126037 | 5/1991 | Japan . |

*Primary Examiner*—Thorl Chea
*Attorney, Agent, or Firm*—Sughrue, Mion, Zinn, Macpeak & Seas

[57] ABSTRACT

The present invention provides a photosensitive transfer sheet which does not generate cutting powder when the exposed and developed transfer sheet is cut with scissors as needed after forming an image. Additionally, no film floating and image disruption accompanied by a kink mark generated on handling the exposed and developed transfer sheet are observed. Furthermore, the above-described performance and transferability are maintained even under low humidity conditions. The photosensitive transfer sheet includes (a) a support having thereon (b) a peeling layer containing an organic polymer, the peeling layer having thereon (c) a photopolymerizable photosensitive resin layer, in which the peeling layer further contains at least one compound selected from the group consisting of compounds represented by the following formulae (1) and (2),

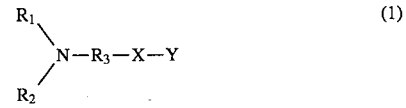

(1)

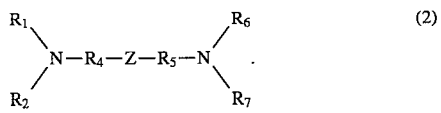

(2)

7 Claims, No Drawings

PHOTOSENSITIVE TRANSFER SHEET

FIELD OF THE INVENTION

The present invention relates to a photosensitive transfer sheet for preparing a prepress proof, a color display, and the like for color proofing.

BACKGROUND OF THE INVENTION

Known methods of color proofing (prepress proofing) which use a photopolymer include an overlay method and a surprint method. In the overlay method, plural sheets having separation images of different color formed on transparent supports are prepared and then placed upon one another to conduct color proofing. In the surprint method, a multicolor image is obtained by successively forming separation images of different color on a single support.

Image-forming materials for use in both the above-mentioned overlay and surprint methods are described, for example, in JP-A-59-97140 (The term "JP-A" as used herein means an "unexamined published Japanese patent application"). JP-A-59-97140 discloses a photo-sensitive transfer sheet having a peeling layer made of an organic polymer and a photosensitive resin layer successively formed on a support (hereinafter occasionally referred to as a "temporary support"). A color proofing sheet having a multicolor image is obtained by exposing and developing the respective photosensitive transfer sheets to form separation images followed by repeatedly transferring the separation images to an arbitrary support.

In order to obtain good transfer properties, the characteristics of the peeling layer play an important role in the photo-sensitive transfer sheet comprising a support having thereon a peeling layer made of an organic polymer and a photosensitive resin layer in this order. Alcohol-soluble polyamides such as copolymerized nylon and N-alkoxymethyl nylon are known materials for such peeling layers. However, when an alcohol-soluble polyamide is used alone, adhesion of the peeling layer to the temporary support increases under humid conditions, because the peeling layer readily absorbs moisture. This occasionally causes a transfer failure. Furthermore, the peeling layer made of an alcohol-soluble polyamide tends to stains due to dyes, a pigment, etc. upon development, to thereby result in the so-called colorant fog.

To solve the above-described problems, JP-A-61-188537 proposes a photosensitive transfer sheet having a peeling layer comprising a mixture of an alcohol-soluble polyamide and a hydroxystyrene type polymer. According to this method, a peeling layer having excellent resistance to moisture can be formed on a support. As a result, even when the transfer step of a separation image is carried out in a high humidity environment, and after the transfer sheet having the image formed thereon is adhered to a support of an image-receiving sheet, etc. by application of heat and pressure, the support (temporary support) of the transfer sheet is readily peeled from the peeling layer. This is because the peeling layer does not substantially absorb moisture. In other words, the transfer operation can be carried out without being affected by high humidity. Furthermore, the development step for forming the separation image on the photosensitive transfer sheet leaves little stain on the peeling layer due to colorants such as dyes and pigments, to thereby markedly prevent colorant fog.

However, preparation of gang proofs (proofs made according to a multiple face setting method) requires cutting the exposed and developed transfer sheets with scissors before carrying out the transfer steps for the second and subsequent colors for positioning in accordance with the corresponding originals. The transfer sheets having the above-described peeling layer tend to generate a powder upon cutting, and this cutting powder occasionally adheres to the transfer sheets. Because the cutting powder is taken like dusts or foreign substances in a color proof thus prepared, the transfer sheet significantly degrades the quality of the color proof.

Furthermore, when the photosensitive transfer sheets are large, the exposed and developed sheets tend to generate kink marks on handling. This causes film floating (a phenomenon where an image formed on a peeling layer is peeled together with the peeling layer from a support) in portions where the kink marks are generated and image disruption (an image formed on a peeling layer is broken off together with the peeling layer by cracking).

Furthermore, the above-mentioned cutting powder, film floating and image disruption become pronounced at low humidity, and these problems arise, for example, during the winter when humidity decreases. JP-A-3-126037 describes a peeling layer made of an alcohol-soluble polyamide containing a basic compound and an alkali-soluble organic polymer. However, when the basic compound is added in an amount needed to reduce the above-described cutting powder, film floating, image disruption, and the like, the transfer properties deteriorate.

SUMMARY OF THE INVENTION

An object of the present invention is to provide a photosensitive transfer sheet which does not generate a cutting powder when the exposed and developed transfer sheet is cut with scissors and the like, as needed, after an image is formed thereon.

Another object of the present invention is to provide a photosensitive transfer sheet which does not develop film floating and image disruption accompanied by a kink mark generated on handling the exposed and developed transfer sheet.

A further object of the present invention is to provide a photosensitive transfer sheet which maintains the above-described performance and transfer properties even at low humidity.

Other objects and effects of the present invention will be apparent from the following description.

The above objects of the present invention have been accomplished by a photosensitive transfer sheet comprising (a) a support having thereon (b) a peeling layer containing an organic polymer and (c) a photopolymerizable photosensitive resin layer in this order, wherein the peeling layer further contains at least one compound selected from the group consisting of compounds represented by the following general formulae (1) and (2):

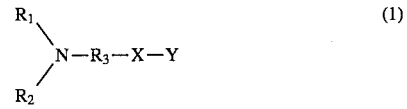

In the above formula (1), $R_1$ and $R_2$ each independently represents an hydrogen atom, or an alkyl or aralkyl group which may have a substituent group. The alkyl group and an alkyl moiety in the aralkyl group preferably has from 1 to 6 carbon atoms. Examples of the substituent group include an alkyl, alkoxy and acylamino group having from 1 to 6 carbon atoms, a halogen atom, a carbamoyl group, and —NHCONH—$R_{10}$ (—NHCONH— is hereinafter referred to as a "urea linkage", and $R_{10}$ is an alkyl or aryl group having from 1 to 10 carbon atoms). Of these, preferred substituent groups are an alkyl, alkoxy group, and acylamino group having from 1 to carbon atoms, and —NHCONH—$R_{10}$. Examples of the aralkyl group represented by $R_1$ and $R_2$ include

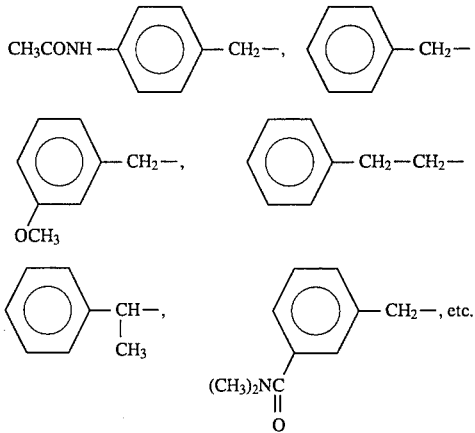

$R_1$ and $R_2$ may bond to each other to form a 5- or 6-membered saturated heterocyclic ring with the nitrogen atom in formula (1), wherein $R_1$ and $R_2$ may contain a hetero atom selected from the group consisting of an oxygen atom, a sulfur atom and a nitrogen atom as a ring forming atom. Examples of the saturated heterocyclic ring include

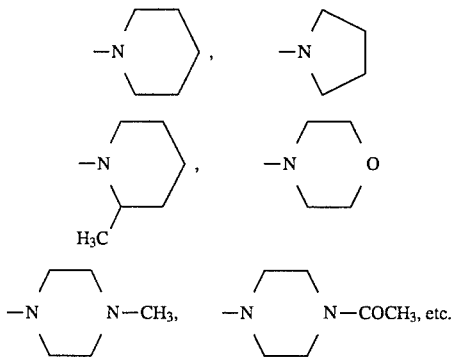

$R_3$ represents an alkylene group or an alkylene group containing an ether linkage. The alkylene group or alkylene group containing an ether linkage represented by $R_3$ has from to 10 carbon atoms, and preferably 3 to 6 carbon atoms. X represents an ether linkage, an amide linkage, an urea linkage, or

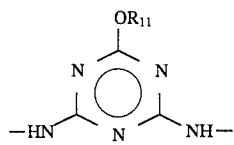

wherein $R_{11}$ represents an alkyl group having 1 to 5 carbon atoms. Y represents a hydrogen atom, or an alkyl, aralkyl, or aryl group which may have a substituent group. The alkyl, aralkyl and aryl group represented by Y has from 1 to 20 carbon atoms. The substituent group for the alkyl, aralkyl or aryl group represented by Y includes an alkyl, alkoxy and acylamino group having from 1 to 6 carbon atoms, a halogen atom, a carbamoyl group, and —NHCONH—$R_{10}$. $R_{10}$ is as defined above. Of these, preferred substituent groups are an alkyl, alkoxy, acylamino group having from 1 to 6 carbon atoms, and —NHCONH—$R_{10}$.

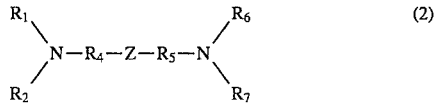

In the above formula (2), $R_1$, $R_2$, $R_6$ and $R_7$ each independently represents a hydrogen atom, or an alkyl or aralkyl group which may have a substituent group. The alkyl group and an alkyl moiety in the aralkyl group preferably has from 1 to 6 carbon atoms. Similar to $R_1$ and $R_2$ in formula (1), the substituent group includes an alkyl, alkoxy, and acylamino group having from 1 to 6 carbon atoms, a halogen atom, a carbamoyl group, and —NHCONH—$R_{10}$ ($R_{10}$ is an alkyl or aryl group having from 1 to 10 carbon atoms). Of these, preferred substituent groups are an alkyl, alkoxy, and acylamino group having from 1 to 6 carbon atoms, and —NHCONH—$R_{10}$. Examples of the aralkyl group represented by $R_1$, $R_2$, $R_6$ and $R_7$ include the same aralkyl groups as examples of the aralkyl group represented by $R_1$ and $R_2$ in formula (1). $R_1$ and $R_2$ or $R_6$ and $R_7$ may each independently bond to each other to form a 5- or 6-membered saturated heterocyclic ring with the nitrogen atom in formula (2), wherein $R_1$ and $R_2$ or $R_6$ and $R_7$ may contain a hetero atom selected from the group consisting of an oxygen atom, a sulfur atom and a nitrogen atom as a ring forming atom. Examples of the saturated heterocyclic ring include the same saturated heterocyclic ring as in formula (1). $R_4$ and $R_5$ each independently represents an alkylene group having from 1 to 6 carbon atoms, and Z represents a linkage group for bonding $R_4$ to $R_5$. The linkage group, Z, represents an ether linkage, a thioether linkage, an urea linkage, —N($R_8$)—, —NHCO—$R_9$—CONH—, —NHCONH—$R_9$—NHCONH—, or (OCH$R_{12}$CH$_2$)$_n$. Although Z may be selected from among the above-described linkage groups without particular limitation, an ether linkage, an urea linkage, —NHCO—$R_9$—CONH—, —NHCONH—$R_9$—NHCONH—, or —(OCH$R_{12}$CH$_2$)$_n$—is preferred. n represents 0 or an integer of 1 to 5, and preferably 0 or an integer of 1 to 3. $R_8$ represents a hydrogen atom, or an alkyl or acyl group having from 1 to 6 carbon atoms. $R_9$ represents an alkylene, aralkylene, or arylene group having from 1 to 8 carbon atoms. $R_{12}$ represents a hydrogen atom or a methyl group.

The present invention will be described in greater detail below.

DETAILED DESCRIPTION OF THE INVENTION

The photosensitive transfer sheet of the present invention has a structure which substantially comprises a support having thereon, a peeling layer and a photopolymerizable photosensitive resin layer in this order. The photosensitive transfer sheet can be produced, for example, according to the following method.

Substances having chemical and thermal stability and flexibility are used as a material for the support. The substances may be transparent to actinic rays as needed. Examples thereof include cellulose acetate, polyvinyl chloride, polystyrene and polypropylene as described in JP-A-47-41830, JP-A-48-9337 and JP-A-51-5101. However, polyethylene terephthalate, polycarbonates and heat treated products thereof are particularly preferred. The thickness of the support generally ranges from 25 to 500 μm, and preferably from 50 to 100 μm.

For improving its processability, a back layer comprising a polymeric substance such as polyvinyl butyral, cellulose acetate and/or copolymers of vinyl chloride with vinyl acetate may be formed on the side of the support opposite to the side on which the peeling layer is formed. Furthermore, the back layer may include various additives such as a matting agent.

The support is provided with a peeling layer formed of an organic polymer. A material for the peeling layer is suitably selected from among known materials for a peeling layer. Examples thereof include alcohol-soluble polyamides, hydroxystyrene type polymers, a mixture of an alcohol-soluble polyamides and a hydroxystyrene type polymer, polyvinyl acetate, poly(meth)acrylate, polyvinyl chloride, polyvinyl butyrate, copolymers of methyl methacrylate with acrylate, copolymers of polyethylene with (meth)acrylic acid, metal-crosslinked products of copolymers of polyethylene with (meth)acrylic acid, cellulose acetate butyrate, copolymers of vinyl chloride with vinyl acetate, cellulose diacetate, cellulose triacetate, polyvinyl alcohol, blends of methoxymethylated nylon and partially esterified resins derived from copolymers of styrene with maleic anhydride. A preferred material is a mixture of an alcohol-soluble polyamide and a hydroxystyrene type polymer. The ratio of the alcohol-soluble polyamide to the hydroxystyrene type polymer preferably ranges from 4 to 6 to 9 to 1 (by weight), to enhance the peeling property of the peeling layer from the support under humid conditions and adhesion to an image-receiving side of a support on transferring.

The alcohol-soluble polyamide of the present invention includes linear polyamides synthesized from dibasic aliphatic acids and diamines, ω-amino acids, lactams, or derivatives thereof by known methods. The linear polyamide may be in any form of homopolymer, copolymer or block copolymer. A polyamide which has substituent groups on a carbon atoms and/or a nitrogen atom constituting its main chain, and a polyamide which contain the linkage except for C—C linkage and C—N—C linkage in its main chain can also be used. Specific examples of the above-described polyamide include nylon 3, nylon 4, nylon 5, nylon 6, nylon 8, nylon 11, nylon 12, nylon 13, nylon 66, nylon 610, nylon 1313; polymers of m-xylylenediamine with adipic acid; polymers of trimethyl-hexamethylenediamine with terephthalic acid; linear homopolyamides of 1,4-diaminomethylcyclohexane with suberic acid; copolymerized polyamides Such as nylon 6/nylon 66/nylon 610, nylon 6/nylon 66/nylon 610/nylon 612, nylon 6/nylon 66/nylon 12, ε-caprolactam/adipic acid/hexamethylenediamine/4,4'-diaminodicyclohexylmethane, etc; and derivatives thereof such as N-methylol substituted, N-alkoxyalkyl substituted, and N-allyloxyalkyl substituted products, etc. The alcohol-soluble polyamide for use in the present invention preferably has a viscosity (in 10% (by weight) methanol solution at 20° C.) within a range of 0.2 to 70 cps. The above-described alcohol-soluble polyamide may be used alone or in combination of two or more kinds thereof. The hydroxystyrene type polymer of the present invention includes polyhydroxystyrene; derivatives thereof such as alkyl, alkoxy, and aralkyl substituted products, etc; copolymers of hydroxystyrene with vinyl compounds. Examples of the vinyl compounds include vinyltoluene, styrene halide, vinylethylbenzen, methoxystyrene; vinyl heterocyclic compounds such as N-vinylcarbazole, vinylpyridine, vinyloxazole, vinylpyrrolidone, etc; vinylcycloalkanes such as vinylcyclohexane, etc; acrylic esters such as alkyl (meth)acrylate, aralkyl (meth)acrylate, aryl (meth)acrylate, etc; acrylamides such as acrylonitrile, etc. The average number ratio of a hydroxystyrene unit to the total number of units in the hydroxy styrene type polymer of the present invention is preferably more than 40%.

The peeling layer can be formed by dissolving the above-mentioned material in a suitable solvent to prepare a coating solution, followed by applying the solution to the support and drying. Various types of surfactants can be added to the coating solution to modify the surface conditions, and fluorine type surfactants are particularly effective. The thickness of the peeling layer generally ranges from 0.1 to 20 μm, preferably from 0.2 to 5 μm, and particularly preferably from 0.3 to 3 μm.

At least one compound is selected from the group of compounds represented by the above-described formulae (1) and (2) are added to the coating solution for the peeling layer.

These additives can be used singly or as a mixture of two or more different compounds.

The compounds represented by formulae (1) and (2) are added to the peeling layer preferably in an amount of 0.5 to 20% by weight based on the weight of the above-described organic polymer forming the peeling layer. An amount exceeding 20% by weight is unfavorable because of the resulting excessive tackiness of the surface of the peeling layer. The content is more preferably from 0.5 to 10% by weight.

Preferred examples of the compounds represented by formulae (1) and (2) that are added to the peeling layer of the photosensitive transfer sheet of the present invention include the following compounds (1) to (18). However, compounds usable in the present invention should not be construed as being limited to these compounds.

Compound 1

Compound 2

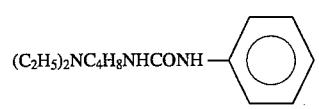

Compound 3

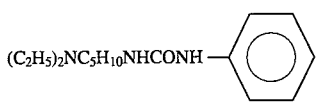

Compound 4

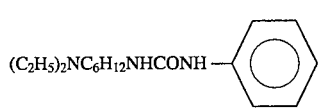

Compound 5

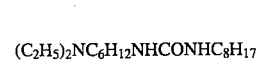

Compound 6

Compound 7
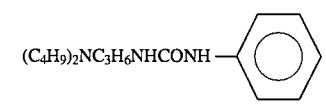
(C₄H₉)₂NC₃H₆NHCONH—⟨phenyl⟩

Compound 8
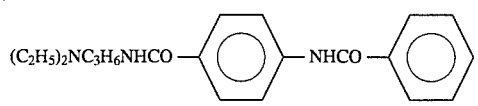
(C₂H₅)₂NC₃H₆NHCO—⟨phenyl⟩—NHCO—⟨phenyl⟩

Compound 9
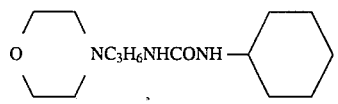
O⟨morpholine⟩NC₃H₆NHCONH—⟨cyclohexyl⟩

Compound 10
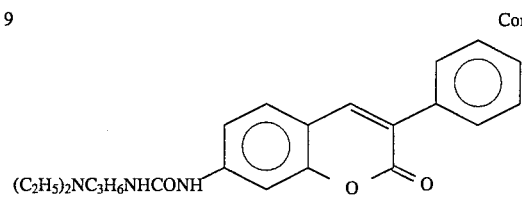
(C₂H₅)₂NC₃H₆NHCONH—⟨coumarin-phenyl⟩

Compound 11
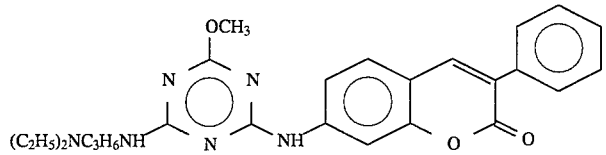
(C₂H₅)₂NC₃H₆NH—⟨triazine(OCH₃)⟩—NH—⟨coumarin-phenyl⟩

Compound 12
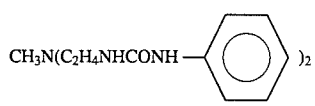
CH₃N(C₂H₄NHCONH—⟨phenyl⟩)₂

Compound 13
(C₂H₅)₂NC₃H₆NHCO(CH₂)₄CONHC₃H₆N(C₂H₅)₂

Compound 14
(C₂H₅)₂NC₂H₄NHCONH(CH₂)₆NHCONHC₂H₄N(C₂H₅)₂

Compound 15
(C₂H₅)₂NC₃H₆NHCONH(CH₂)₆NHCONHC₃H₆N(C₂H₅)₂

Compound 16
(C₂H₅)₂NC₃H₆NHCO—⟨phenyl⟩—CONHC₃H₆N(C₂H₅)₂

Compound 17
(C₂H₅)₂NC₃H₆NHCONHC₃H₆N(C₂H₅)₂

Compound 18
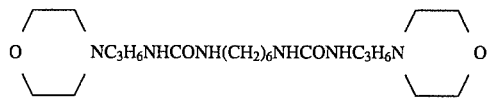
O⟨morpholine⟩NC₃H₆NHCONH(CH₂)₆NHCONHC₃H₆N⟨morpholine⟩O

A photopolymerizable photosensitive resin layer is formed on the peeling layer. Various kinds of known materials used for photosensitive transfer sheets can be employed for the photopolymerizable photosensitive resin layer. However, preferred photopolymerizable photosensitive resins are those which develop in water or in an alkaline solution.

The photopolymerizable photosensitive resin layer usually comprises at least one monomer compound such as a vinyl monomer and a vinylidene compound which has a boiling point of 150° C. or higher at atmospheric pressure and which can form a photopolymer through addition polymerization, a polymeric organic binder and a photopolymerization initiator activated by irradiation with active rays. A thermopolymerization inhibitor may be added to the layer as needed.

Useful vinyl monomers or the vinylidene compounds for forming the photopolymerizable photosensitive resin layer preferably include, for example, unsaturated esters of polyols, particularly esters with acrylic acid or methacrylic acid. Examples thereof include ethylene glycol diacrylate, glycerin triacrylate, polyacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetra-methacrylate, pentaerythritol diacrylate, pentaerythritol triacrylate, pentaerythritol tetraacrylate, dipentaerythritol polyacrylates, 1,3-propanediol diacrylate and 1,5-pentane-diol dimethacrylate, and bisacrylate, bismethacrylate and analogous compounds of polyethylene glycols having a molecular weight ranging from 200 to 400.

Unsaturated amides can also be used as the monomer compound. Examples thereof include unsaturated amides of acrylic acid and methacrylic acid containing an α,ω-diamine and ethylene bismethacrylamide. Alkylene chains of the unsaturated amides may be linear or branched.

The photopolymerizable monomer for use in the present invention should not be construed as being limited to the above-described compounds.

Examples of the polymeric organic binder include addition polymers having a side chain containing a carboxylic acid group such as copolymers of methacrylic acid (for example, copolymers of methyl methacrylate with methacrylic acid, copolymers of ethyl methacrylate with methacrylic acid, copolymers of butyl methacrylate with methacrylic acid, copolymers of allyl methacrylate with methacrylic acid, copolymers of ethyl acrylate with methacrylic acid, copolymers of ethyl methacrylate, styrene and methacrylic acid, copolymers of benzyl methacrylate with methacrylic acid, etc.); copolymers of acrylic acid (copolymers of ethyl acrylate with acrylic acid, copolymers of butyl acrylate with acrylic acid, copolymers of ethyl acrylate, styrene, and acrylic acid, etc.); and, in addition, copolymers of itaconic acid, copolymers of crotonic acid and partially esterified copolymers of maleic acid, and acidic cellulose derivatives similarly having a side chain containing a carboxylic acid group. However, the binders usable in the present invention should not construed as being limited to the above-described examples.

These polymeric organic binders may be used, singly or as a mixture of two or more binders in a suitable ratio. Such binders in admixture should have good compatibility with one another to the extent that the binders do not separate during the manufacturing steps from preparation of a coating solution to coating and drying.

These polymeric organic binders may have a wide range of molecular weights which vary depending on the type of polymer. However, the molecular weight generally ranges from 5,000 to 2,000,000, and more preferably from 10,000 to 1,000,000.

An appropriate ratio of the monomer compound to the polymeric organic binder varies depending upon the particular combination of the monomer compound with the polymeric organic binder. However, in general, the ratio is preferably from 1 to 10 to 2 to 1 (by weight).

Examples of the photopolymerization initiator include aromatic ketones such as benzophenone, Michler's ketone [4,4'-bis(dimethylamino)benzophenone], 4,4'-bis-(diethylamino)benzophenone, 4-methoxy-4'-dimethylamino-benzophenone, 2-ethylanthraquinone, phenanthraquinone, and other aromatic ketones; benzoin ethers such as benzoin, benzoin methyl ether, benzoin ethyl ether, and benzoin phenyl ether; benzoins such as methylbenzoin, ethylbenzoin, etc.; and 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer; 2,4,5-triacrylimidazole dimer as described in U.S. Pat. Nos. 3,479,185 and 3,784,557, and British Patent 1,047,569; and halomethyl-S-triazine compounds and halomethyloxathiazole compounds described in U.S. Pat. Nos. 3,954,475, 3,987,037 and 4,189,323, JP-B-57-6096 (The term "JP-B" as used herein means an "examined Japanese patent publication".), JP-A-60-177340, JP-A-61-151644, JP-A-62-58241, JP-A-63-58440, etc.

When a compound containing a trihalomethyl group is used as the photopolymerization initiator, the additive of the present invention represented by formulae (1) and (2) provides a particularly marked effect. Examples of preferred photopolymerization initiators are shown below. However, the compounds for use in the present invention should not be construed as being limited to these examples.

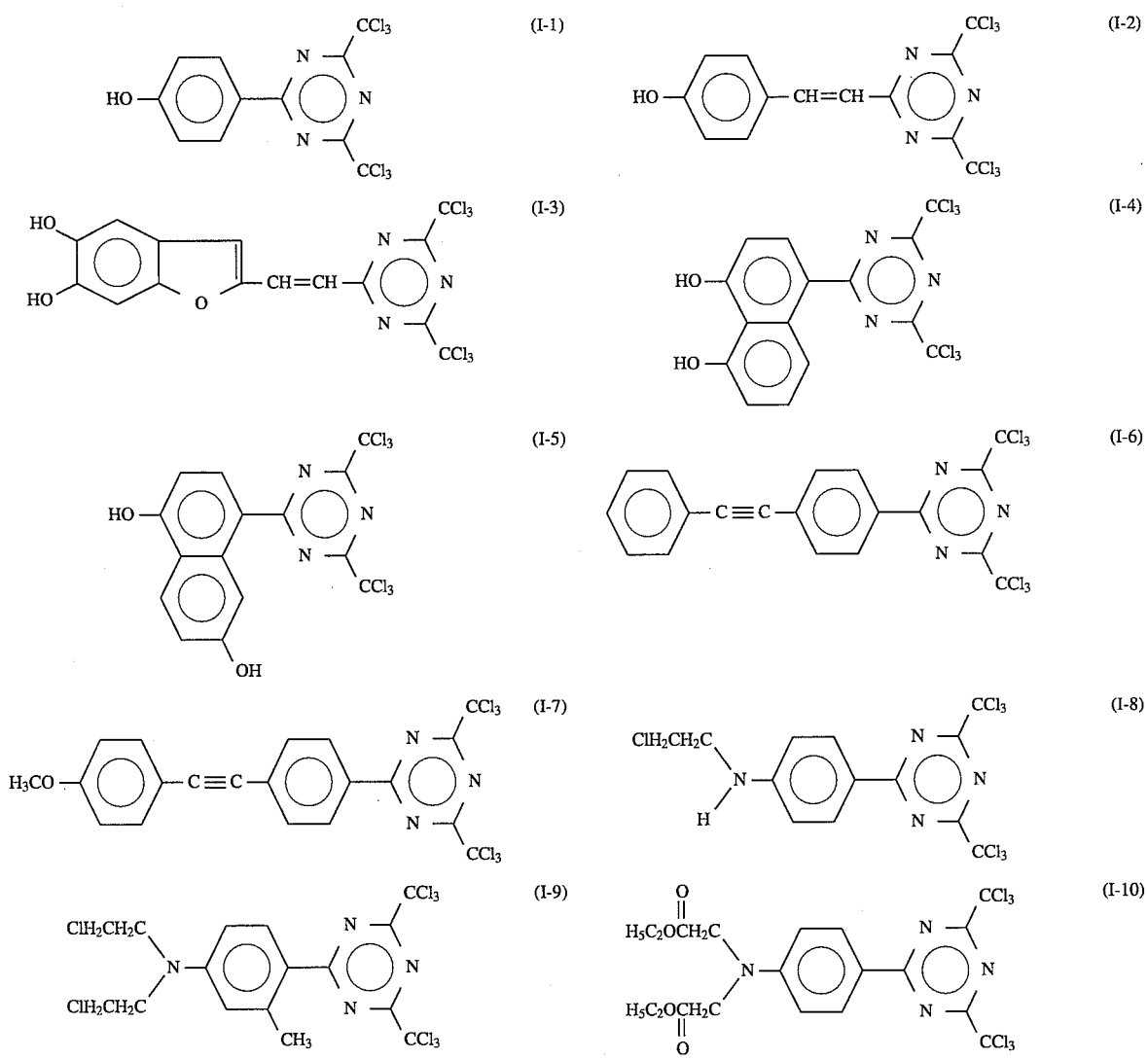

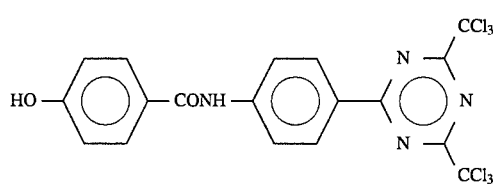 (I-11)

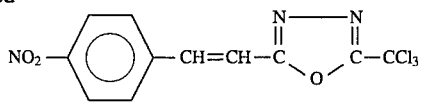 (I-12)

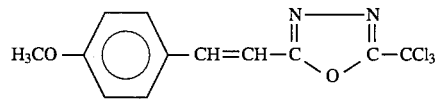 (I-13)

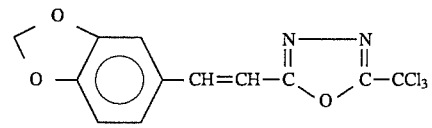 (I-14)

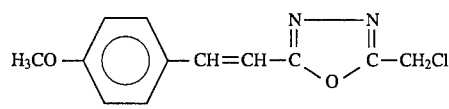 (I-15)

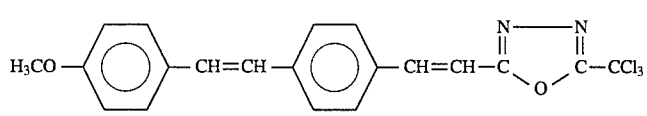 (I-16)

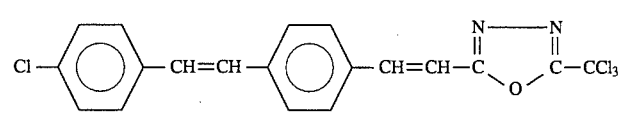 (I-17)

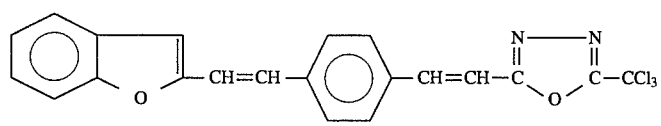 (I-18)

(I-19)

The addition amount of the photopolymerization initiator preferably ranges from 0.01 to 20% by weight, based on the weight of the monomer compound contained in the photopolymerizable photosensitive layer. Examples of useful thermopolymerization inhibitors include p-methoxyphenol, hydroquinone, alkyl- or arylsubstituted hydroquinones, t-butylcatechol, pyrogallol, naphthylamine, β-naphthol, phenothiazine, pyridine, nitrobenzene, o-toluquinone, and arylphosphites. However, the inhibitors should not be construed as being limited to these examples.

The thickness of the photopolymerizable photosensitive resin layer generally ranges from 0.5 to 150 μm, and preferably from 2 to 100 μm.

Details of materials and a process for forming the photosensitive resin layer are described, for example, in U.S. Pat. Nos. 3,721,557, 3,920,677, 4,482,625, JP-B-46-15326, JP-B-46-35682, JP-A-47-41830, JP-A-48-93337, JP-A-49-441, JP-A-51-5101, JP-A-59-97140, etc.

When a coloring substance is used, the substance may be included in the photopolymerizable photosensitive resin layer or in a separate colorant layer. The colorant layer may be formed on either of the upper side or the lower side of the photopolymerizable photosensitive resin layer. However, to increase the sensitivity of the photo-polymerizable photosensitive resin layer in an image exposure step, the photopolymerizable photosensitive resin layer is preferably formed on the colorant layer. Although known pigments and dyes can be used as the coloring substances, pigments (yellow, magenta, cyan, and black) equivalent to color ink in hue are preferably used for color proofing for printing. Details of useful coloring pigments and the colorant layer are disclosed, for example, in JP-A-59-97140.

Furthermore, a protective layer is preferably formed on the photopolymerizable photosensitive resin layer. The protective layer can be formed by applying a solution of a polymeric substance such as polyvinyl alcohol, polyvinyl acetate, copolymers of methyl vinyl ether with maleic anhydride, polyvinyl pyrrolidone, gelatin, and gum arabic to the photopolymerizable photosensitive resin layer followed by drying.

The thus prepared photosensitive transfer sheet of the present invention can be used for color proofing, for example, according to the following surprint method.

1) Plural color separation masks corresponding to the hue of the transfer sheet and each having a different original are, respectively, placed on the transfer sheet. Exposure is conducted by irradiating a photosensitive transfer sheet with active rays through each of the color separation masks. (hereinafter referred to as a multiple face setting) (Exposure Step).

2) The transfer sheet is treated with a developer to form plural separation images on the peeling layer (Development Step).

3) The above-described first and second steps are repeated using photosensitive transfer sheets having different hues, to thereby obtain 2 to 4 unicolored transfer sheets.

4) The transfer sheet having the separation image of the first color subjected to the multiple face setting is placed upon an image-receiving sheet having a photopolymerizable image-receiving layer formed on a support. The separation image is brought into contact with the image-receiving layer, followed by application of heat and pressure. The separation image adheres to the image-receiving sheet to the extent that the separation image is embedded into the uncured image-receiving layer. Subsequently, the support (temporary support) of the transfer sheet is peeled, to thereby transfer the image and the peeling layer to the image-receiving sheet (Transfer Step).

5) Prior to carrying out a similar operation using the remaining sheets having a unicolored image, the respective separation images of the second and later colors subjected to the multiple face setting are cut with scissors. The respective separation images thus cut are successively transferred to the same image-receiving sheet while positioning with the separation image of the first color. The separation images of the 2 to 4 colors subjected to the multiple face setting are formed on the image-receiving sheet such that the separation images are embedded into the image-receiving layer.

6) The image-receiving layer of the image-receiving sheet to which a multicolor image has been transferred is placed upon a sheet of white paper to bring the multicolored image into contact with the white paper. The multicolored image is then adhered to the white paper by application of heat and pressure.

7) The entire surface of the sheet is irradiated with active rays through the support of the image-receiving sheet so that the photopolymerizable image-receiving layer is subjected to photocuring.

8) The image having 2 to 4 colors which comprises plural different images depending on the number of color separation masks employed are formed on the white paper by peeling the support (temporary support) from the image-receiving sheet. Fine unevenness may be formed on the surface of the image-receiving layer, if desired, by heating and pressing a mat film, etc. which is placed onto the image-receiving layer.

In the above-described operations, the separation images are transferred to a sheet of white paper as a final support. Various kinds of paper, metals, films, and glass can also be used as the support. Furthermore, the respective separation images can also be directly transferred to the final support without use of intermediate image-receiving sheets.

Furthermore, the 2 to 4 unicolored transfer sheets which are obtained in the above-described third step can also be used for color proofing according to the overlay method by directly and precisely superposing the sheets upon one another.

The photosensitive transfer sheet of the present invention is also used for forming color displays as described, for example, in U.S. Pat. No. 4,260,673.

The present invention is described in greater detail below by reference to the following examples. However, the present invention should not be construed as being limited thereto.

EXAMPLE 1

A coating solution having the following composition was applied to a polyethylene terephthalate film (thickness: m) used as a support, and was dried to form a peeling layer having a dried thickness of 1.0 μm. Four such support having thereon a peeling layer were prepared. Coating Solution for Peeling Layer:

Alcohol-Soluble Polyamide (CM-8000, Viscosity: 23 cps, Manufactured by Toray Industries, Inc.) 5.4 g Polyhydroxystyrene (Resin M, Average Molecular Weight: 5000, Manufactured by Maruzen Oil Co., Ltd.) 3.6 g Additive (Compound 10), selected from compounds represented by formulae (1) and (2) 0.54 g Methanol 400 g Methyl Cellosolve 100 g Four photosensitive coating solutions of different colors, yellow (Y), magenta (M), cyan (C) and black (K), having the following compositions, respectively, were prepared for forming the photopolymerizable photosensitive resin layers.

Coating Solution for Photopolymerizable Photosensitive Resin Layers:

(1) Yellow Photosensitive Coating Solution:
Copolymer of Benzyl Methacrylate with Methacrylic Acid (Molar Ratio: 73 to 27, Viscosity η: 0.12) 60 g
Pentaerythritol Tetraacrylate 43.2 g
2,4-Bis(trichloromethyl)-6-[4-(4-hydroxybenzoylamino)phenyl]-S-triazine 1.81 g
Seika Fast Yellow-H-7055 (Manufactured by Dainichiseika Colour & Chemicals Mfg. Co., Ltd.) 9.4 g
Methyl Cellosolve Acetate 560 g
Methyl Ethyl Ketone 280 g
Fluorine Type Surfactant (Florade FC-430, manufactured by Sumitomo 3M Limited) 1 g (2) Magenta Photosensitive Coating solution:
Copolymer of Benzyl Methacrylate with Methacrylic Acid (Molar Ratio: 73 to 27, Viscosity η: 0.12) 60 g
Pentaerythritol Tetraacrylate 43.2 g
2,4-Bis(trichloromethyl)-6-[4-(4-hydroxybenzoylamino)phenyl]-S-triazine 1.81 g
Seika Fast Carmine 1483 (Manufactured by Dainichiseika Colour & Chemicals Mfg. Co., Ltd.) 5.2 g
Methyl Cellosolve Acetate 560 g
Methyl Ethyl Ketone 280 g
Fluorine Type Surfactant (Florade FC-430, Manufactured by Sumitomo 3M Limited) 1 g (3) Cyan Photosensitive Coating Solution:
Copolymer of Benzyl Methacrylate with Methacrylic acid (Molar Ratio: 73 to 27, Viscosity η: 0.12) 60 g
Pentaerythritol Tetraacrylate 43.2 g
2,4-Bis(trichloromethyl)-6-[4-(4-hydroxybenzoylamino)phenyl]-S-triazine 1.81 g
Cyanine Blue-4920 (Manufactured by Dainichiseika Colour & Chemicals Mfg. Co., Ltd.) 5.6 g
Methyl Cellosolve Acetate 560 g
Methyl Ethyl Ketone 280 g
Fluorine Type Surfactant (Florade FC-430, Manufactured by Sumitomo 3M Limited) 1 g (4) Black Photosensitive Coating Solution:
Copolymer of Benzyl Methacrylate with Methacrylic Acid (Molar Ratio: 73 to 27, Viscosity η: 0.12) 60 g
Pentaerythritol Tetraacrylate 43.2 g
2,4-Bis(trichloromethyl)-6-[4-(4-hydroxybenzoylamino)phenyl]-S-triazine 1.81 g
Mitsubishi Carbon Black MA-100 (Manufactured by Mitsubishi Chemical Industries Ltd.) 6.6 g
Methyl Cellosolve Acetate 560 g
Methyl Ethyl Ketone 280 g
Fluorine Type Surfactant (Florade FC-430, Manufactured by Sumitomo 3M Limited) 1 g These four photosensitive coating solutions of different color were each applied to one of the previously prepared four supports having thereon a peeling layer, and dried to form photopolymerizable photosensitive resin layers each having a dried thickness of 2.4 μm.

In addition, for forming protective layers, a coating solution having the following composition was prepared, applied to the respective photopolymerizable photosensitive resin layers of different color, and dried to form protective layers each having a dried thickness of 1.5 μm. Coating Solution for Protective Layer:

Polyvinyl Alcohol (GL-05, Manufactured by The Nippon Synthetic Chemical Industry Co., Ltd.) 60 g Water 970 g Methanol 30 g Thus, four photosensitive transfer sheets of different colors were prepared (negative type colored photosensitive sheets), each comprising a support, a peeling layer, a photopolymerizable photosensitive resin layer, and a protective layer in this order.

EXAMPLE 2

Four photosensitive transfer sheets each having a different color were prepared in the same manner as in Example 1, except that the additive used in the coating solution for the peeling layer in Example 1 was replaced by the same weight of Compound 9 selected from compounds represented by formulae (1) and (2).

EXAMPLE 3

Four photosensitive transfer sheets each having a different color were prepared in the same manner as in Example 1, except that the additive used in the coating solution for the peeling layer in Example 1 was replaced by the same weight of Compound 8 selected from compounds represented by formulae (1) and (2).

EXAMPLE 4

Four photosensitive transfer sheets each having a different color were prepared in the same manner as in Example 1, except that the additive used in the coating solution for the peeling layer in Example 1 was replaced by the same weight of Compound 15 selected from compounds represented by formulae (1) and (2).

EXAMPLE 5

Four photosensitive transfer sheets each having a different color were prepared in the same manner as in Example 1, except that the additive used in the coating solution for the peeling layer in Example 1 was replaced by the same weight of Compound 17 selected from compounds represented by formulae (1) and (2).

EXAMPLE 6

Four photosensitive transfer sheets each having a different color were prepared in the same manner as in Example 1, except that the alcohol-soluble polyamide used in the coating solution for the peeling layer in Example 1 was replaced by Toresin MF-30 (Manufactured by Teikoku Kagaku Sangyo Co., Ltd.).

COMPARATIVE EXAMPLE 1

Four photosensitive transfer sheets each having a different color were prepared in the same manner as in Example 1, except that the additive used in the coating solution for the peeling layer in Example 1 was excluded.

COMPARATIVE EXAMPLE 2

Four photosensitive transfer sheets each having a different color were prepared in the same manner as in Example 6, except that the additive used in the coating solution for the peeling layer in Example 6 was excluded.

COMPARATIVE EXAMPLE 3

Four photosensitive transfer sheets each having a different color were prepared in the same manner as in Example 1, except that the additive used in the coating solution for the peeling layer in Example 1 was replaced by the same weight of diethanolamine.

COMPARATIVE EXAMPLE 4

Four photosensitive transfer sheets each having a different color were prepared in the same manner as in Example 1, except that the additive used in the coating solution for the peeling layer in Example 1 was replaced by the same weight of triethanolamine. (Evaluation of Photosensitive Transfer Sheet)

Each of the four photosensitive transfer sheets prepared in the Examples and comparative Examples were evaluated according to the methods described below in terms of generation of cutting powder, film floating (or film cracking) and image transferability.

(1) Preparation of Test Sample

The photosensitive transfer sheets were imagewise exposed with a 1-kW extra-high pressure mercury lamp (manufactured by Dainippon Screen Mfg. Co., Ltd.) for 60 seconds, and then processed in an automatic processor (Color Art Processor CA-600P manufactured by Fuji Photo Film Co., Ltd.) at 31° C. for 22 seconds using a 5-fold diluted solution of Color Art Developer CA-1 (manufactured by Fuji Photo Film Co., Ltd.) to prepare test samples.

(2) Test for Generation of Cutting Powder

The thus prepared test samples were cut with scissors, and sections thereof were observed with a magnifier. The samples were evaluated according to the following criteria.

A: Cutting powder was not generated.

B: Some cracking was observed, but cutting powder was not generated.

C: Extensive cracking and a considerable amount of cutting powder were both generated.

(3) Test for Film Floating (or Film Cracking)

In the above-described test samples, kink marks were produced by manually handling the samples, and the kink marks were observed with a magnifier. The samples were evaluated according to the following criteria.

A: No film floating and cracking were developed in a portion where the kink mark was made.

B: Bending marks were developed but no film floating was developed in a portion where the kink mark was made.

C: Extensive film floating and much cracking were both developed in a portion where the kink mark was made.

(4) Test for Image Transferability

The four photosensitive transfer sheets each having a different color which were prepared in Examples 1 to 6 and comparative Examples 1 to 4, respectively, were evaluated for image transferability (pattern evaluation) using image-receiving sheets prepared as described below. Corresponding color separation masks were placed upon each of the four photosensitive transfer sheets having a different color using register pins. The transfer sheet were imagewise exposed with a 1-kW Extra-High Pressure Mercury Lamp P-607FW (manufactured by Dainippon Screen Mfg. Co., Ltd.) for 60 seconds and then processed in an automatic processor (Color Art Processor-CA-600P, manufactured by Fuji Photo Film Co., Ltd.) at 31° C. for 22 seconds using 5-fold diluted solution of Color Art Developer CA-1 (manufactured by Fuji Photo Film Co., Ltd.). Thus, for each Example and comparative Example, four transfer sheets of different color were obtained which were faithfully reproduced from the color separation masks.

In addition, a coating solution having the formulation described below was prepared and applied to films formed of a biaxially stretched polyethylene terephthalate having a thickness of 100 μm, and was dried to form a image-receiving layer having a dried thickness of 20 μm, to thereby prepare image-receiving sheets. Coating Solution for Image-Receiving Layer:

Polymer of Methyl Methacrylate (Average molecular weight: 100,000, manufactured by Wako Pure Chemicals Industries, Ltd.) 90 g Pentaerythritol Tetraacrylate 90 g 2,2-Dimethoxy-2-phenylacetophenone 3.18 g p-Methoxyphenol 0.09 g Methyl Ethyl Ketone 220 g Subsequently, a black transfer sheet (first color) was placed upon an image-receiving sheet material so as to bring the image side of the transfer sheet into contact with the film surface of the material, and the sheets were laminated using a Color Art Transfer Press CA-600T (manufactured by Fuji Photo Film Co., Ltd.). Thereafter, the support of the photosensitive transfer sheet was peeled to transfer a black image to the image-receiving sheet. The three remaining sheets each having a different color were accurately positioned and successively transferred to the same sheet, to obtain an image-receiving sheet having a four-colored halftone dot image.

Subsequently, the image-receiving sheet having transferred thereto a four-colored image was placed upon a sheet of art paper (final support) and the sheets were laminated using the above-described transfer press. Thereafter, the entire surface of the laminate was exposed from the image-receiving sheet side using a P-607FW Roomlight Printer (manufactured by Dainippon Screen Mfg. Co., Ltd. equipped with a 1-kW extra-high pressure mercury lamp) for seconds, and subsequently the support of the image-receiving sheet was removed to form a final image on the art paper (a color proofing sheet).

The color proofing sheets were evaluated according to the following four criteria, A to D.

A: When transferred to the image-receiving sheet, the four transfer sheets each having a different color exhibited both good peeling property and thermal adhesive quality, and the images formed on the image-receiving sheet were also of good quality.

B: The four transfer sheets each having a different color were acceptable for practical use, although the sheets were somewhat inferior to those of the above-described criteria A.

C: The four transfer sheets each having a different color exhibited both an inadequate peeling property and thermal adhesive quality, when transferred to the image-receiving sheets.

D: The four transfer sheets each having a different color exhibited a yet lower peeling property than those of criteria C. These samples also exhibited poor thermal adhesive quality, and were unacceptable for practical use.

The above-described tests were conducted under room conditions of 20° C. –20% RH or 23° C.-60% RH (as measured by a SY type electrically powered ventilating psychrometer manufactured by Yoshino Keiki Seisakusho). The results of these tests are shown in Table 1 (20° C.–20% RH) and Table 2 (23° C.–60% RH), respectively.

TABLE 1

| | Additive | Generation of Cutting Powder | Film Floating | Image Transferability |
|---|---|---|---|---|
| Example | | | | |
| 1 | Compound 10 | A | A | A |
| 2 | Compound 9 | B | A | A |
| 3 | Compound 8 | A | A | A |
| 4 | Compound 15 | A | A | A |
| 5 | Compound 17 | A | A | A |
| 6 | Compound 10 | B | A | A |
| Comparative Example | | | | |
| 1 | None | C | C | A |
| 2 | None | C | C | A |
| 3 | Diethanolamine | A | A | D |
| 4 | Triethanolamine | A | A | D |

TABLE 2

| | Additive | Generation of Cutting Powder | Film Floating | Image Transferability |
|---|---|---|---|---|
| Example | | | | |
| 1 | Compound 10 | A | A | A |
| 2 | Compound 9 | A | A | A |
| 3 | Compound 8 | A | A | A |
| 4 | Compound 15 | A | A | A |
| 5 | Compound 17 | A | A | A |
| 6 | Compound 10 | A | A | A |
| Comparative Example | | | | |
| 1 | None | B | B | A |
| 2 | None | B | B | A |
| 3 | Diethanolamine | A | A | A |
| 4 | Triethanolamine | A | A | B |

As shown above, the photosensitive transfer sheet of the present invention did not generate a cutting powder, or result in film floating and image disruption. The effect of this invention are particularly pronounced at low humidity conditions. Furthermore, the transfer sheet provided good image transfer property as well. This makes it possible to obtain a final image having excellent image quality under either low or high humidity conditions. Thus the photosensitive transfer sheet of the present invention is well adapted for preparing a color proof, display, and the like for color proofing.

While the invention has been described in detail and with reference to specific examples, it will be apparent to one skilled in the art that various changes and modifications can be made without departing from the spirit and scope thereof.

What is claimed is:

1. A photosensitive transfer sheet comprising (a) a support having thereon (b) a peeling layer containing an organic polymer, said peeling layer having thereon (c) a photopolymerizable photosensitive resin layer, wherein said peeling layer further contains at least one compound selected from the group consisting of compounds represented by the following formulae (1) and (2):

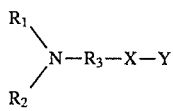

(1)

wherein $R_1$ and $R_2$ each independently represents a hydrogen atom, or an alkyl or aralkyl group which may have a substituent group; $R_1$ and $R_a$ may bond to each other to form a 5- or 6-membered saturated heterocyclic ring with the nitrogen atom in formula (1), wherein $R_1$ and $R_2$ may contain a hetero atom selected from the group consisting of an oxygen atom, a sulfur atom and a nitrogen atom as an atom in the ring; $R_3$ represents an alkylene group or an alkylene group containing an ether linkage; X represents an ether linkage, an amide linkage, a urea linkage, or

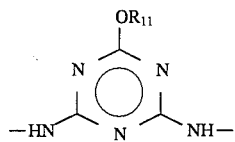

wherein $R_{11}$ represents an alkyl group having 1 to 5 carbon atoms; and y represents a hydrogen atom, or an alkyl, aralkyl, or aryl group which has from 1 to 20 carbon atoms and which may have a substituent group;

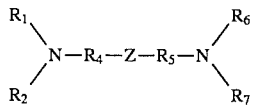

(2)

wherein $R_1$, $R_2$, $R_6$, and $R_7$ each independently represents a hydrogen atom, or an alkyl or aralkyl group which may have a substituent group; $R_1$ and $R_2$ or $R_6$ and $R_7$ may each independently bond to each other to form a 5- or 6-membered saturated heterocyclic ring with the nitrogen atom in formula (2), wherein $R_1$ and $R_2$ or $R_6$ and $R_7$ may contain a hetero atom selected from the group consisting of an oxygen atom, a sulfur atom and a nitrogen atom as an atom in the ring; $R_4$ and $R_5$ each independently represents an alkylene group having from 1 to 6 carbon atoms; and Z represents a linkage group for bonding $R_4$ to $R_5$.

2. The photosensitive transfer sheet as claimed in claim 1, wherein said peeling layer contains a compound represented by formula (1).

3. The photosensitive transfer sheet as claimed in claim 1, wherein said peeling layer comprises a mixture of an alcohol-soluble polyamide and a hydroxystyrene polymer.

4. The photosensitive transfer sheet as claimed in claim 1, wherein said peeling layer contains a compound represented by at least one of formulae (1) and (2) in an amount of 0.5 to 20% by weight based on the weight of the organic polymer.

5. The photosensitive transfer sheet as claimed in claim 2, wherein said peeling layer contains a compound represented by formula (1) in an amount of 0.5 to 20% by weight based on the weight of the organic polymer.

6. The photosensitive transfer sheet as claimed in claim 3, wherein said peeling layer contains a compound represented by at least one of formulae (1) and (2) in an amount of 0.5 to 20% by weight based on the weight of the organic polymer.

7. The photosensitive transfer sheet as claimed in claim 1, wherein said photopolymerizable photosensitive resin layer contains a compound having a trihalomethyl group.

* * * * *